United States Patent [19]

Chang et al.

[11] 4,426,583

[45] Jan. 17, 1984

[54] ELECTRON BEAM POTENTIAL SWITCHING APPARATUS

[75] Inventors: Tai-Hon P. Chang, Chappaqua; Phillip J. Coane, Mahopac; Fritz-Jurgen Hohn, Armonk; Dieter P. Kern, Yorktown Heights, all of N.Y.

[73] Assignee: International Business Machines Corporation, Armonk, N.Y.

[21] Appl. No.: 376,350

[22] Filed: May 10, 1982

[51] Int. Cl.³ .............................................. H01J 3/14
[52] U.S. Cl. .................................................. 250/398
[58] Field of Search ...................... 250/396, 398, 492.3, 250/306, 310, 311; 219/121 EB, 121 ES

[56] References Cited

U.S. PATENT DOCUMENTS

| | | | |
|---|---|---|---|
| 3,634,645 | 1/1972 | Lempert et al. | 250/398 X |
| 3,835,327 | 9/1974 | Lawrence | 250/398 |
| 4,274,035 | 6/1981 | Fukahara et al. | 250/311 X |

Primary Examiner—Alfred E. Smith
Assistant Examiner—Jack I. Berman
Attorney, Agent, or Firm—Ronald L. Drumheller

[57] ABSTRACT

The electron potential of an electron beam is switched between different values without moving the focal plane by effectively changing the axial position of the electron source at the same time that the electron potential is changed. The effective change in axial position of the electron source exactly compensates for the altered effectiveness which magnetic lenses have upon an electron beam of altered electron potential such that the final focal plane remains at the same position without adjusting the field strength of any magnetic lens.

9 Claims, 3 Drawing Figures

FIG. 1.1
(PRIOR ART)
FIG. 1.2
(PRIOR ART)
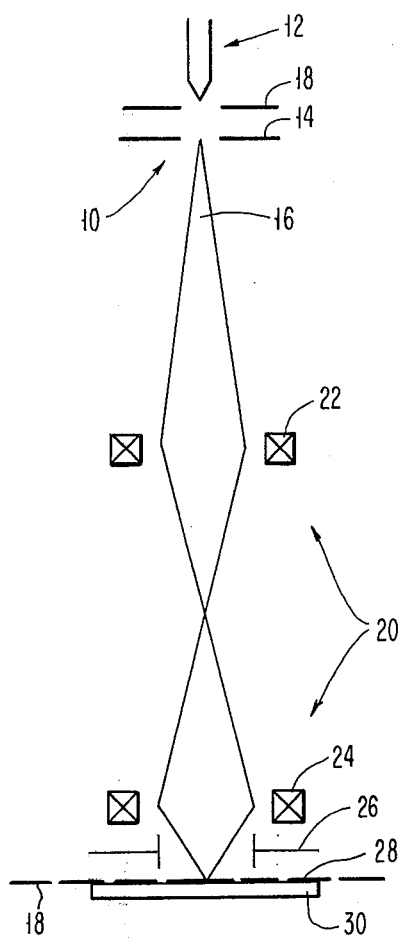
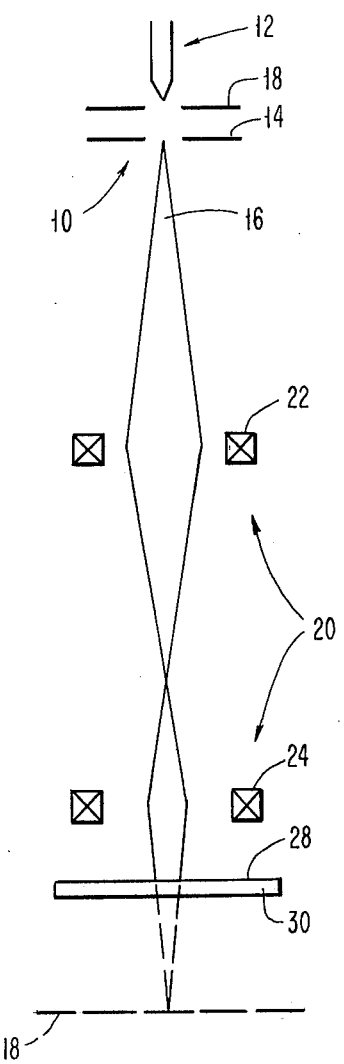

FIG. 3.1
FIG. 3.2
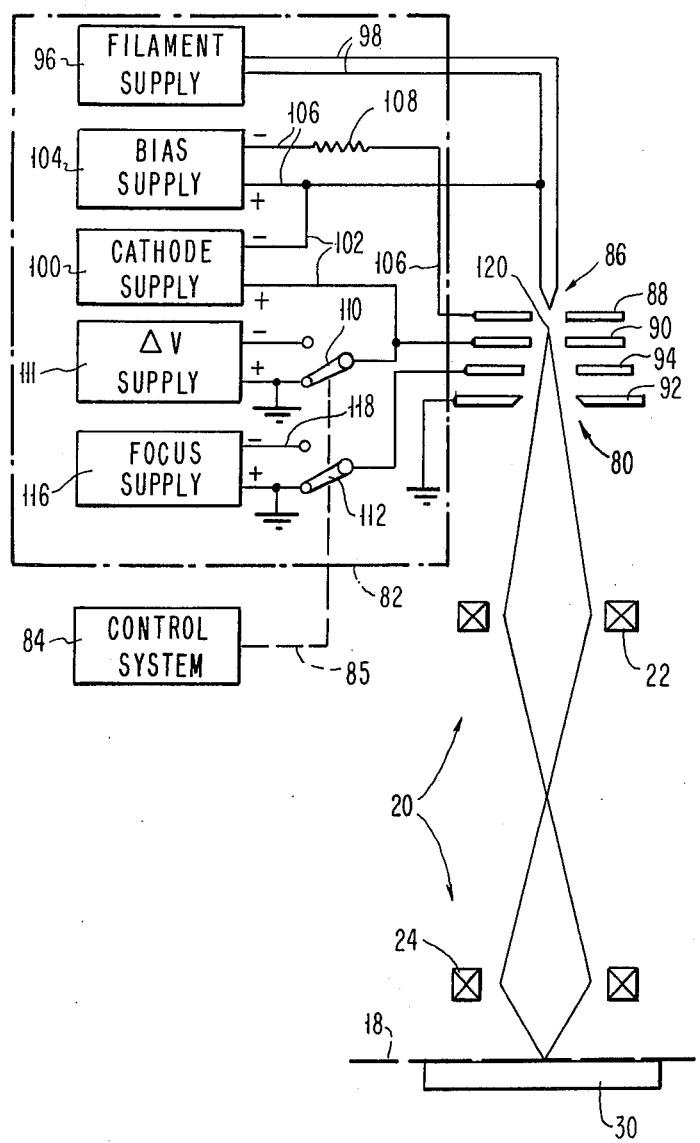
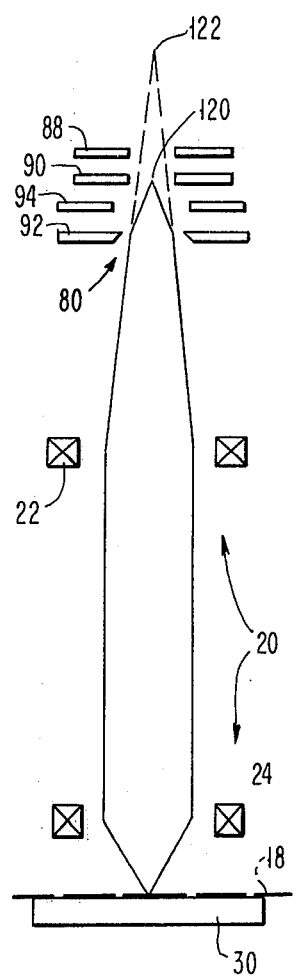

ELECTRON BEAM POTENTIAL SWITCHING APPARATUS

DESCRIPTION

1. Technical Field

This invention pertains to electron beam apparatus and more particularly to apparatus for producing an electron beam having an electron potential which can be switched quickly between two or more values.

2. Background Art

IBM Technical Disclosure Bulletin article "Tri-Potential Method for Testing Electrical Opens and Shorts in Multilayer Ceramic Packaging Modules" (Vol. 24, No. 11A, April 1982 at pages 5388-90), which is hereby incorporated by reference, describes a method of making a functional electrical test of a multilayer ceramic chip carrier using a scanning electron beam to address test points at two different electron potentials, one for charging and one for inspection. In order for this testing method to be practical, the electron beam potential must be switched between the two different electron potential values as quickly as possible.

Ordinarily, when the electron potential of an electron beam is increased, the field strengths of associated electron optical elements also must be increased at the same time so that the final focal plane of the electron beam does not move. In theory, all the variables necessary to switch an electron beam potential could be simultaneously changed by a control system. Unfortunately, the field strengths of electron optical lenses (particularly magnetic lenses) can be changed only slowly in comparison with conventional electronic switching speeds. The field strength of a magnetic lens can be changed only by changing the current level in a coil having a large inductance. Accordingly, the speed at which the electron potential of an electron beam can be changed is ordinarily limited by the speed at which the field strengths of electron optical elements in the electron optical column can be changed.

It is an object of this invention to avoid this speed limitation when switching an electron beam between different electron potentials.

Another object is to provide apparatus for switching the electron potential of an electron beam between different values as quickly and as conveniently as possible without moving the final focal plane.

Still another object is to provide apparatus for switching the electron potential of an electron beam between different values without moving the final focal plane and without changing the field strengths of associated magnetic lenses in the electron optical column.

DISCLOSURE OF THE INVENTION

These and further objects are achieved by this invention, in which the electron potential of an electron beam is switched between different values without moving the focal plane by effectively changing the axial position of the electron source at the same time that the electron potential is changed. The effective change in axial position of the electron source exactly compensates for the altered effectiveness which magnetic lenses have upon an electron beam of altered electron potential such that the final focal plane remains at the same position without adjusting the field strength of any magnetic lens.

In one embodiment the electron source is effectively moved by providing two or more sources of electrons at effectively different axial locations with respect to the electron optical column lenses. The electron potential of the electron beam is then changed by switching between the different sources of electrons.

In another embodiment, the electron source is provided with an acceleration electrode for quickly switching the electron potential between different values. The electron source also has a focusing electrode which acts to simultaneously change the virtual position of the electron source.

BRIEF DESCRIPTION OF THE DRAWINGS

FIGS. 1.1 and 1.2 illustrate electron beams at different electron potentials in a conventional electron beam system when the field strengths of magnetic lenses are not changed.

FIGS. 3.1 and 3.2 illustrate a second embodiment of this invention in which the source of electrons has an acceleration electrode and a focusing electrode in addition to the Wehnelt electrode and anode.

BEST MODES FOR CARRYING OUT THE INVENTION

Figure 2:
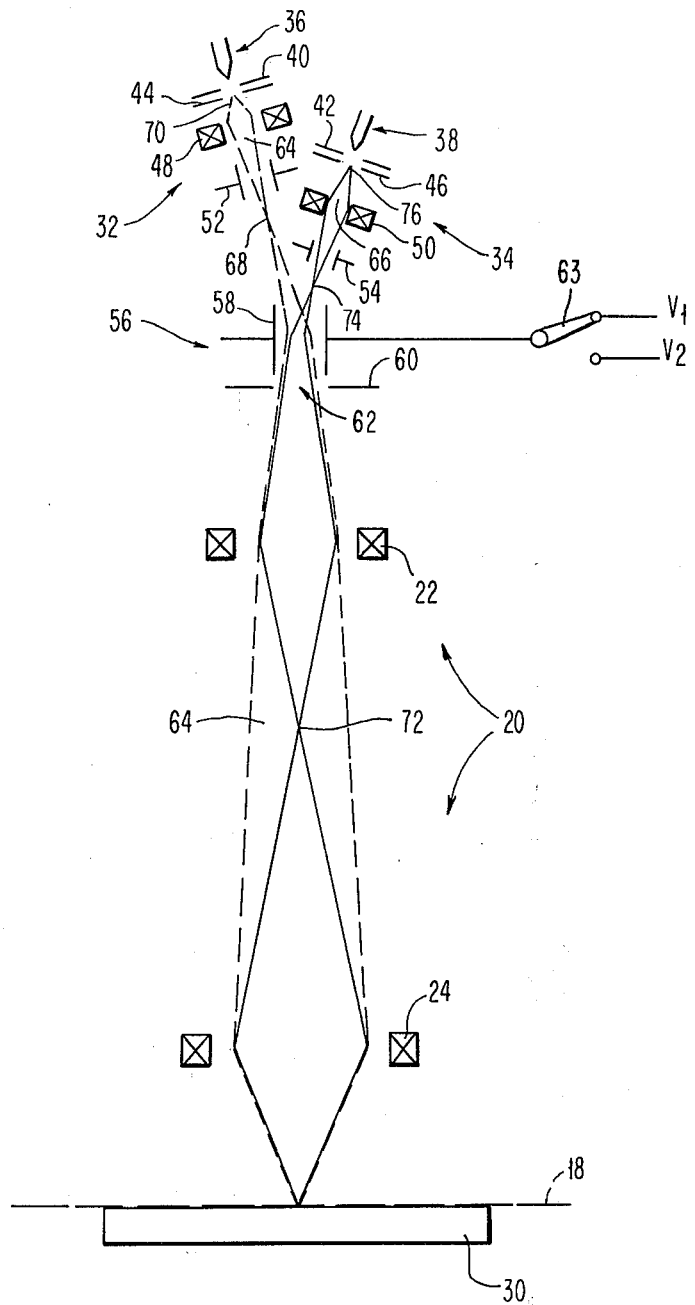
FIG. 2 illustrates a first embodiment of this invention in which two sources of electrons share the same electron optical column and are effectively positioned at different axial locations with respect to the electron optical lenses.

FIG. 1.1 shows conventional electron beam apparatus, which includes an electron beam source 10 comprising a cathode or filament 12 for emitting electrons, an anode 14 for forming an electron beam 16 from emitted electrons, and a Wehnelt electrode 18 for limiting to a small area the region of cathode 12 from which electrons are extracted by anode 14 to form the electron beam 16. The electron beam 16 is focused upon a final focal plane 18 by an electron optical column 20 comprising magnetic lenses 22, 24 and deflection plates or coils 26. The velocity or energy (electron potential) of electrons within the beam is determined by the voltage potential through which the electrons are accelerated, which is the voltage difference between the anode and cathode (assuming the anode and target are at the same potential). With a suitable electron potential and with appropriate magnetic field strengths for lenses 22, 24, the final focal plane 18 may be caused to coincide axially with the top surface 28 of a sample 30, as shown.

FIG. 1.2 illustrates what happens in the prior art electron beam apparatus of FIG. 1.1 when the electron potential (energy of the electrons) of the beam is increased without changing the strengths of the magnetic lenses 22, 24. The electrons in beam 16 now have a higher velocity and are focused less by the magnetic lenses 22, 24. As a result, the focal plane 18 is axially displaced and no longer coincides with surface 28 of sample 30. In order to cause the focal plane to coincide with surface 28 when the electron potential is increased, the field strengths of lenses 22, 24 also must be increased appropriately. To increase the strengths of magnetic lenses 22, 24 requires that the current levels in the associated coils be increased. These coils ordinarily have very high inductance so that the current cannot be changed very quickly in comparison with ordinary electronic switching speeds. This forms a limitation in the speed at which the electron beam potential can be switched.

In accordance with the present invention, FIG. 2 illustrates electron beam potential switching apparatus which avoids this limitation because the field strengths of lenses 22, 24 are not changed when the electron beam potential is switched to another value. The electron beam potential switching apparatus of this embodiment has more than one electron beam source. Two sources 32, 34 are illustrated but a higher number could be used instead to switch among a correspondingly larger number of beam potentials. Electron beam sources 32, 34 have cathodes 36, 38, Wehnelt electrodes 40, 42 and anodes 44, 46, all of which function in a conventional manner. Sources 32, 34 also have lenses 48, 50 for independently focusing the sources and deflection plates or coils 52, 54, for independently aligning the sources.

In a conventional electron beam apparatus, such as illustrated in FIG. 1.1, focusing adjustment usually is done instead with one of the principle lenses 22, 24 of the associated electron optical column. Alignment adjustment is done by biasing additional alignment deflection plates (not shown) at the top of the electron optical column.

Returning to FIG. 2, between the two sources 32, 34 and the associated electron optical column 20 of conventional construction is beam selection apparatus 56 comprising deflection plates 58 and shield 60 having an aperture 62. Electron beam sources 32, 34 are oriented such that a first potential $V_1$ applied by switch 63 to plates 58 will deflect beam 64 from source 32 through aperture 62 and down column 20. At the same time, beam 66 from source 34 is deflected such that it does not pass through aperture 62. When a different second potential $V_2$ is applied to plates 58 by switch 63, beam 66 instead is deflected through aperture 62 and down column 20, while beam 64 is deflected such that it does not pass through aperture 62.

It should be apparent that more than two electron beam sources could be arranged at the top of an electron optical column and deflected only one at a time down the column. Similarly, it should be apparent that, if desired, one of the sources could be physically aligned with the column axis instead of having all of the alternative sources oriented obliquely to the electron optical column axis.

In accordance with the invention, beams 64, 66 have different beam potentials but are still focused at the same final focal plane 18 (when deflected down column 20 by selector 56). This is possible because the sources 32, 34 may be positioned physically at different axial distances from the electron optical column and/or because they may be independently focused by lenses 48, 50.

Even a large change in electron beam potential is possible because beams 64, 66 may have a different number of cross-overs or intermediate focal points above the final focal plane 18. In FIG. 2 for example, beam 64 has only one intermediate focal point 68 in addition to the electron gun cross-over 70, while beam 66 has two intermediate focal points 72, 74 in addition to the electron gun cross-over 76. It should be apparent from the much lesser deflection effect that lenses 22, 24 have upon beam 64 in comparison to beam 66 that beam 64 has a substantially higher beam potential.

Another electron beam switching apparatus in accordance with this invention is illustrated in FIG. 3.1 and comprises a pentode electron gun 80, a conventional electron optical column 20, a voltage switching circuit 82 for driving the pentode electron gun, and a control system 84, such as a computer for controlling the voltage switching circuit. The pentode electron gun 80 comprises a conventional filament or cathode 86, a conventional Wehnelt electrode 88, a conventional anode 90, an acceleration electrode 92, and a focusing electrode 94. Cathode 86, Wehnelt electrode 88 and anode 90 function just as in a conventional triode electron gun. Floating filament supply 96 powers a filament via lines 98 sufficiently that either the filament itself or a cathode heated by the filament emits electrons. Floating cathode supply 100 maintains a constant voltage $V_o$ between the cathode 86 and anode 90 via lines 102. Floating bias supply 104 maintains a constant voltage difference between Wehnelt electrode 88 and cathode 86 via lines 106 and resistor 108.

Although the voltages of the conventional parts of the pentode gun (the cathode, Wehnelt and anode) with respect to each other are adjustable, the relative voltages once adjusted are not switched to other values in this embodiment when the beam potential is switched, though the absolute voltages of these parts are floated and will change. The beam potential is changed by changing the voltage applied between accelerating electrode 92, and anode 90. The acceleration electrode 92 is maintained at the same potential as anode 90 for a first beam potential and the anode 90 is switched to a more negative potential than acceleration electrode 92 for a second (higher) beam potential. This is done by lowering the absolute potentials of the cathode, Wehnelt and anode with respect to the acceleration electrode 92. At the first beam potential, anode 90 is grounded through switch 110. The acceleration electrode 92 is always grounded so that it will remain at the same potential as the target. Otherwise there would be an additional electron acceleration or deceleration between the last pentode electrode 92 and the target (specimen 30). The focus electrode 94 is also grounded at the first beam potential via switch 112. In order to switch to the second beam potential, switches 110 and 112 are simultaneously thrown by control system 84 via line 85 to the position not illustrated. The potential of anode 90 is thereby changed to a negative potential $\Delta V$ by supply 111. Cathode 86 and Wehnelt 88 are also floated automatically to lower absolute potentials by cathode supply 100 and bias supply 104. The voltage difference between anode 90 and the acceleration electrode 92 ($\Delta V$) acts to increase the energy of electrons within the electron beam by a corresponding amount.

At the same time that the acceleration electrode becomes effective to increase the beam potential, focus supply 116 lowers the potential of focus electrode 94 via switch 112 and lines 118 to a value such that the focal plane 18 of the electron beam does not move. The beam configuration at the second (higher) beam potential is illustrated in FIG. 3.2. While the actual cross-over 120 of the electron beam source has not been moved very much (if any) by the acceleration and focusing electrodes, the trajectories of electrons emerging from the acceleration electrode at the second beam potential has been altered so that the electron beam at the higher second potential appears to have a virtual cross-over 122 farther away than at the first beam potential.

It should be apparent that the voltage switching circuit could be easily modified so that the aceleration and focusing electrodes may be switched each to any one of more than two voltage potentials in order to switch the beam potential among more than two values. Also, the simultaneous aim of changing the total acceleration voltage and changing the focal characteristic such that the focal plane does not move could be implement with either more or less electrodes in an electron gun than the number illustrated.

It should be noted that the electron beams at the two different beam potentials illustrated in FIGS. 3.1 and 3.2 also have a different number of cross-overs, just as in FIG. 2. In both embodiments, it is also possible for the beams of different electron potential to have the same number of cross-overs or intermediate focal points. Furthermore, it is recognized that a change in the number of cross-overs might be exactly compensated for by an appropriate change in beam potential, so that in such a limited case a change in actual position of the electron source would not be needed for the final focal plane to remain at the same position. This type of compensation (a change in the number of cross-overs) is optically equivalent to a large but fixed change in the effective axial location of the source and is regarded as such an equivalent by applicants. It is contemplated that the difference in beam potentials usually desired will be sufficiently large that a change or switch in the number of beam cross-overs will be employed generally to make a large fixed switchable change in the effective source position and that other means for switchably adjusting the effective source position by a smaller amount will be used in combination therewith.

Other and further modification is possible and would be apparent to those of ordinary skill in this field and may be made without departing from the spirit and scope of this invention, which is defined in the following claims.

Having thus described our invention, what we claim as new, and desire to secure by Letters Patent is:

1. Electron beam apparatus, comprising:
   means for generating a first electron beam having a first electron potential;
   means for generating a second electron beam having a second electron potential different from said first electron potential;
   an electron optical column positioned to receive either of said electron beams;
   means for determining which electron beam is received by said electron optical column; and
   the effective source of said second electron beam being effectively positioned at a different axial distance from said electron optical column than the effective source of said first electron beam to compensate for the difference in electron potential, so as to cause said electron optical column automatically to focus either beam onto the same final focal plane without changing the field strength of any electron optical lens in said electron optical column.

2. Electron beam apparatus as defined in claim 1 wherein said means for generating a first electron beam comprises a first electron beam source, said means for generating a second electron beam comprises a second electron beam source, and said means for determining which electron beam is received by said electron beam column comprises electron beam selection apparatus for directing either of said electron beams along said electron optical column while simultaneously blocking the other.

3. Electron beam apparatus as defined in claim 2 wherein said first and second electron beam sources are axially positioned at different physical distances from said electron beam column to compensate at least in part for the difference in electron potential.

4. Electron beam apparatus as defined in claim 2 wherein an individual electron optical lens is associated with each of said electron beam sources to compensate at least in part for the difference in electron potential.

5. Electron beam apparatus as defined in claim 1 wherein said means for generating a first electron beam and said means for generating a second electron beam together comprise an electron beam source having a cathode and four electrodes.

6. Electron beam apparatus as defined in claim 1 wherein said means for generating a first electron beam comprises a first electrode for emitting electrons, a second electrode biased more positively than said first electrode for accelerating said emitted electrons to form said first beam, and a third electrode between said first and second electrodes and biased more negatively than said first electrode for controlling the amount of current in said first electron beam.

7. Electron beam apparatus as defined in claim 6 wherein said means for generating a second electron beam comprises a fourth electrode for further accelerating the electrons of said first beam thereby to form said second beam, said means for determining which electron beam is received by said electron optical column comprising means for biasing said fourth electrode either at a predetermined more positive potential than said second electrode or at the same potential as said second electrode, said first beam being received by said column when said fourth electrode is at the same potential as said second electrode and said second beam being received by said column when said fourth electrode is biased at said predetermined more positive potential.

8. Electron beam apparatus as defined in claim 7 wherein said positioning means comprises a fifth electrode between said second and fourth electrodes for focussing said second electron beam differently than said first electron beam to compensate at least in part for the difference in electron potential.

9. Electron beam apparatus as defined in claim 1 wherein said electron beams have different numbers of intermediate focal points before reaching the same final focal plane to compensate at least in part for the difference in electron potential.

* * * * *